United States Patent [19]

Alexander

[11] 4,037,221
[45] July 19, 1977

[54] TOUCH CONTROLLED SWITCH ASSEMBLY

[76] Inventor: Jerry L. Alexander, 1596 13th Ave., Village of St. Paul Park, Minn. 55071

[21] Appl. No.: 584,251

[22] Filed: June 6, 1975

Related U.S. Application Data

[63] Continuation-in-part of Ser. No. 470,537, May 16, 1974, Pat. No. 3,965,465.

[51] Int. Cl.² .................... G08B 13/26; H01H 36/00
[52] U.S. Cl. .................... 340/258 C; 240/2.13; 307/116; 340/274 R
[58] Field of Search .......... 340/274 R, 258 C; 240/2.13; 200/DIG. 1, 61.62, 61.58 R; 307/125, 294, 116, 308; 328/77, 5; 317/DIG. 2

[56] References Cited

U.S. PATENT DOCUMENTS

| 2,637,801 | 5/1953 | Kelley et al. | 240/2 |
| 3,275,897 | 9/1966 | Atkins | 340/258 C |
| 3,508,239 | 4/1970 | Fontaine | 340/258 |
| 3,774,191 | 11/1973 | Enemark | 340/274 |
| 3,824,576 | 7/1974 | Pioch | 340/274 |

OTHER PUBLICATIONS

Magic Dot, Inc., "Touch Switch Works Remotely, " *Electronics,* Mar. 29, 1973, p. 100.
Baird, Robert D.; "Intruder Alarm is Based on Electrostatic Charge Detection," *Electronic Design,* Apr. 26, 1973, p. 142.
Hoberman, Stu; "Touch Module–This New Version Does Many Jobs," *Popular Science,* Feb. 1973, pp. 124–125.

*Primary Examiner*—Glen R. Swann, III
*Attorney, Agent, or Firm*—William L. Huebsch

[57] ABSTRACT

A switch assembly which activates an electrical load when it receives a triggering signal through a network coupled between a touch plate and the switch assembly. The network continuously has an incoming signal at the touch plate comprising a noise component which may be of constant or slowly changing amplitude depending upon ambient conditions at the touch plate, and which incoming signal is instantaneously changed when an individual contacts the touch plate. The network is adapted to pass such an instantaneous change in the incoming signal as a triggering signal to activate the electrical load, but to block the incoming signal when it consists only of the noise component even when the amplitude of the noise component changes slowly. The switch assembly may include timing means so that when it receives a triggering signal the electrical load is activated for a predetermined time, and when activated may transmit a signal to a remote receiver. The switch assembly is particularly useful for controlling the entryway light of a building, with the latch in a door controlling access to the entryway adapted to function as the touch plate.

14 Claims, 4 Drawing Figures

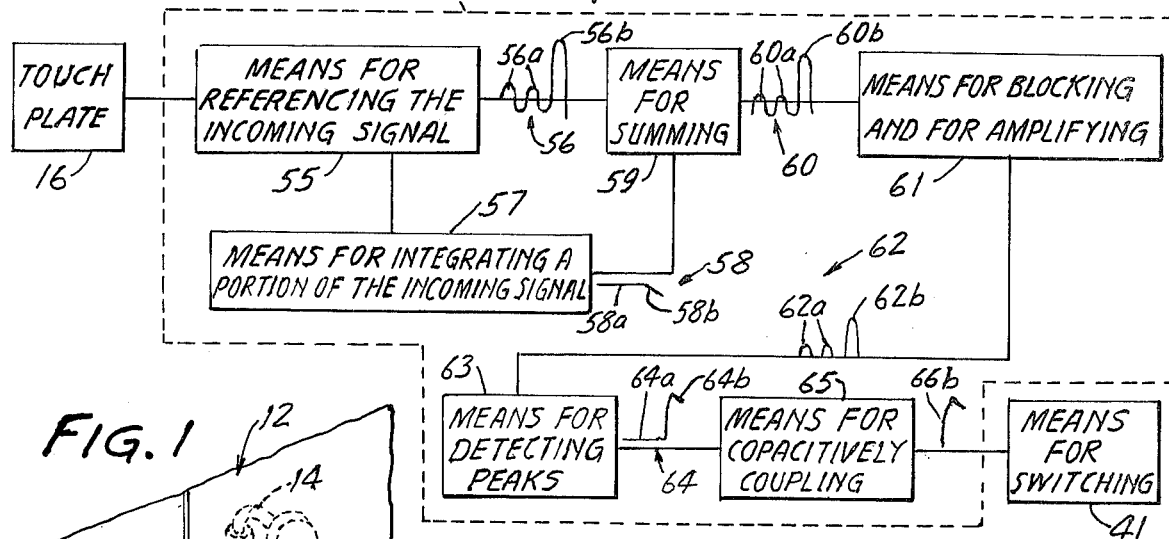
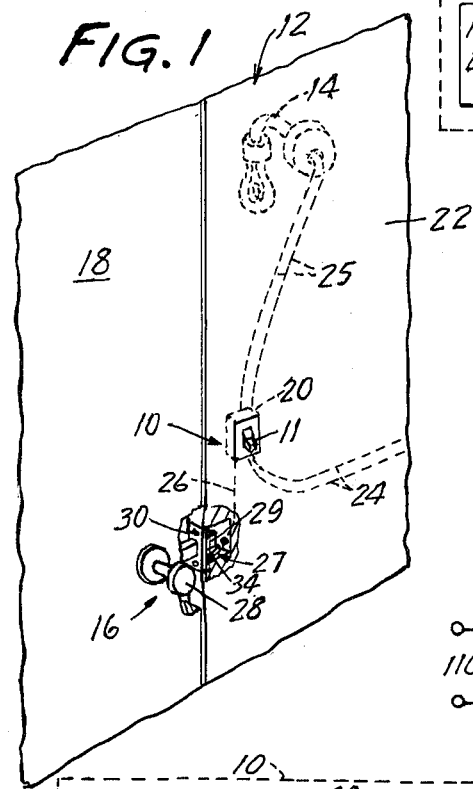
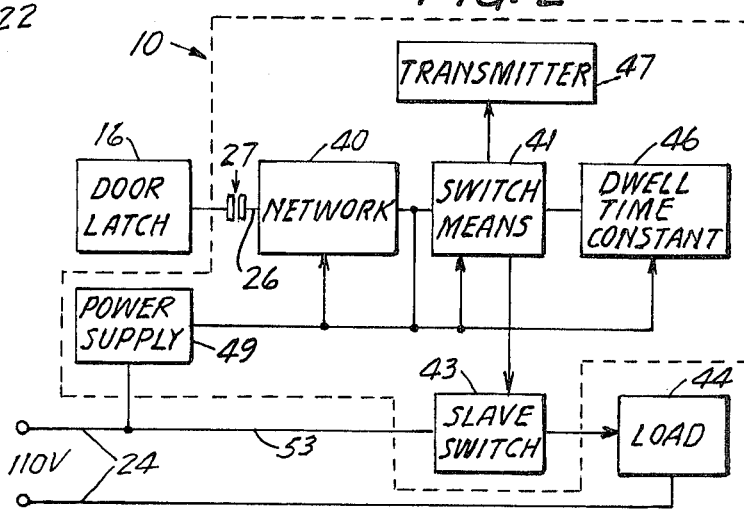
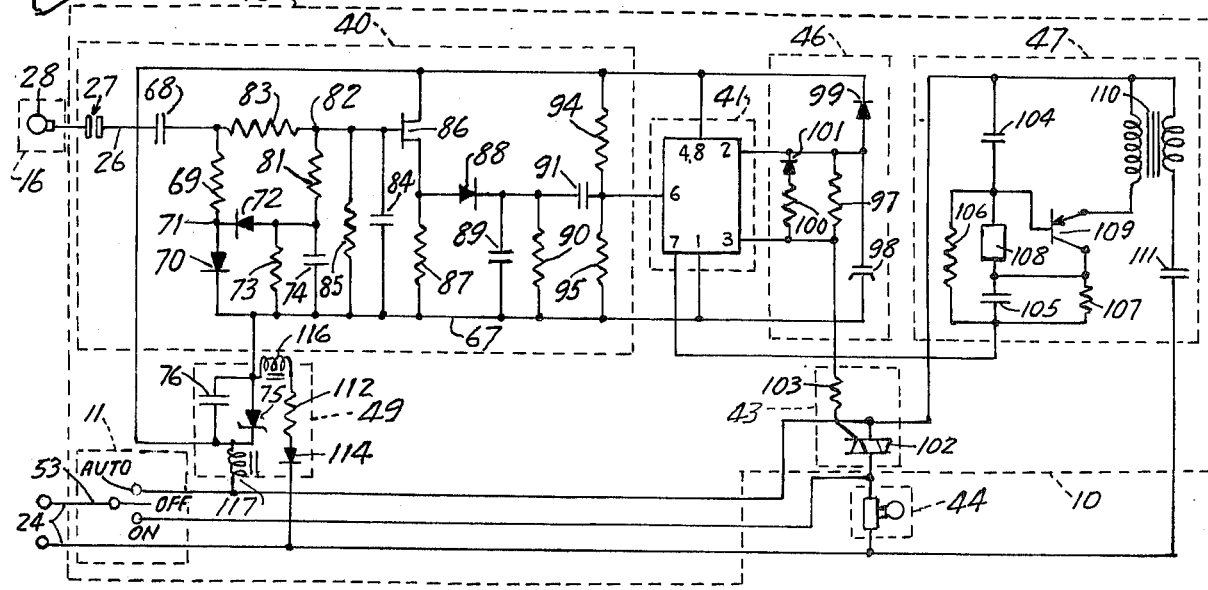

TOUCH CONTROLLED SWITCH ASSEMBLY

CROSS REFERENCE TO RELATED APPLICATION

This is a continuation-in-part of my U.S. patent application Ser. No. 470,537, filed May 16, 1974 now U.S. Pat. No. 3,965,465.

BACKGROUND OF THE INVENTION

This invention relates to switch assemblies adapted to be touch activated, and in one aspect to a switch assembly adapted for activation upon use of a door latch.

My aforementioned pending U.S. application Ser. No. 470,537 (the disclosure whereof is incorporated by reference herein and of which this application is a continuation-in-part) discloses a switch assembly particularly adapted to activate an entry light of a building for a predetermined period of time when a person makes contact with the latch on a door in the entryway (e.g. when the person contacts the door knob with his bare or gloved hand, or inserts his key in the lock). The entry light is activated prior to the operation of the door latch to provide a convenience for authorized persons leaving or entering the building, and a deterrent to unauthorized persons prior to their having gained access to the building.

The switch assembly disclosed in my earlier application includes: (1) switch means which is adapted for being switched from a first state to a second state when a triggering signal having an intensity above a predetermined level is applied at an input to the switch means; and (2) a network coupled to the input to the switch means and adapted to electrically couple the switch means to a touch plate (such as a door latch). At the touch plate, there is an incoming signal comprising a continuously received alternating electrical noise component which may be of constant or slowly changing amplitude depending upon ambient conditions at the touch plate. The incoming signal is instantaneously increased when an individual contacts the touch plate. The network includes means for compensating for environmental changes to preclude false alarms by the switch being actuated by a noise signal, and for providing a triggering signal exceeding the predetermined level to switch the switch means when the incoming signal is increased by an individual contacting the touch plate.

In the switch assembly taught in my earlier application, however, the network between the touch plate and the input to the switch means couples the continuous electrical noise component to the input to the switch means, and includes a sensitivity adjust network which applies a bias voltage at the input to the switch means through a special control. The special control is manually adjusted to provide a bias voltage which prevents the electrical noise component from activating the switch means while allowing the increase in the incoming signal caused by an individual contacting the touch plate to cause a triggering signal exceeding the predetermined level, thereby operating the switch means. One should readjust the special control when atmospheric conditions change, since such atmospheric changes will alter the change in the incoming signal produced by an individual contacting the touch plate and the intensity of the electrical noise component. Otherwise, the combination of a previously established bias level from the special control, and an increased electrical noise component (such as may be received at the touch plate during a thunderstorm) may exceed the predetermined level and activate the switch means without an individual contacting the touch plate. Conversely, when atmospheric conditions change to decrease the change in the incoming signal produced by an individual contacting the touch plate (and the level of the electrical noise component received by the switch assembly), the combined effect of a previously established bias level from the special control and the change in the incoming signal produced when an individual contacts the touch plate may not produce the triggering signal required to exceed the predetermined level and switch the switch means.

SUMMARY OF THE INVENTION

The present invention, like that disclosed in my prior application, provides a switch assembly including a switch means which is adapted for being switched from a first state to a second state when a signal having an intensity exceeding a predetermined level is applied at an input to the switch means; and a network coupled to the input to the switch means and adapted to electrically couple the switch means to a touch plate (such as a door latch). The network includes means for compensating for environmental changes to preclude false alarms resulting from electrical noise signals and for providing a triggering signal exceeding the predetermined level to activate the switch means when an individual contacts the touch plate.

In the present invention, however, the network for electrically connecting the input of the switch means to the touch plate comprises means for automatically blocking the incoming signal when it is of constant amplitude or slowly changing amplitude such as is produced by the electrical noise component alone, and means for passing to the input to the switch means as a triggering signal instantaneous changes or increases in the incoming signal such as are caused by an individual contacting the touch plate. Thus the present invention automatically restricts the risk of inadvertent operation or failure of proper operation of the switch assembly as a result of changing atmospheric conditions.

In a preferred embodiment of the present invention, as diagrammed in FIG. 3 of the drawing, the improved network includes means for referencing the incoming signal to a predetermined reference voltage and integrates a portion of the referenced incoming signal with means for producing a DC voltage of one polarity relative to the predetermined reference voltage. The DC voltage produced is slightly less than the peak to peak voltage of the incoming signal when the incoming signal is of constant or slowly changing amplitude such as is produced by the electrical noise component alone. The integrating means, however, has a time constant which is sufficiently slow such that the DC voltage will not change substantially when an instantaneous change occurs in the incoming signal. This DC voltage is then summed with the incoming signal and is rectified to produce a pulsating resultant signal of generally constant or slowly changing peak potentials when the incoming signal consists only of the noise component, and to produce a pulse with a peak potential significantly larger than that potential produced when the incoming signal is instantaneously changed. Any peaks of such a larger potential in the resultant signal are then sensed with peak detecting means for producing a second DC potential only slightly lower than the peak potential of the last pulse received. Sharp increases in the peak value of the resultant signal, such as are produced when the incoming signal is instantaneously increased, will produce a rapid increase in the second DC voltage. This rapid increase is capacitively coupled as a triggering signal to the input of the switch means. Peak values of the resultant signal which are constant or change slowly, however, will produce a generally constant second DC voltage which will be blocked from the input to the switching means by the capacitive coupling. Thus the rectification, peak detecting means and capacitive coupling provide means for passing as a triggering signal to the switch means only instantaneous changes in portions of the summed signal of polarity opposite said one polarity.

Preferably the device includes a field effect transistor which provides both the means for rectifying the summed signal and means having a high input impedance for amplifying the current associated with the resultant signal so that the capacitively coupled rapid increases therein have sufficient power to activate the switch means.

The instantaneous change or increase in the incoming signal for the present invention can be provided by static electrical charges normally carried by a person. However, reliable operation of the switch is insured, even when a person is totally neutral with respect to the switching system, by means adapted to provide a high impedance source of alternating voltage at the touch plate. The alternating potential, which is in the frequency range of conventional power sources (such as 60 Hertz), is adapted to be safely grounded by a person contacting the touch plate, and means are provided for producing an instantaneous change or increase in the incoming signal upon partial grounding of the alternating voltage.

Like the switch means in the switch assembly taught in my aforementioned earlier application, the switch means in the improved switch assembly disclosed in this application preferably is a known integrated circuit timer, powered by house voltage power, which timer is adapted for being switched from a first stable state to a second quasi-stable state when a signal having an intensity above a predetermined level is applied thereto, and which timer provides an output signal when in the second state. The switch assembly includes a dwell-time-constant network coupled to the switch means for controlling the time during which the switch means remains in the second state and a slave switching means coupled to receive the output signal to a load, so long as the output signal is received. Also the switch assembly preferably includes a means for manually actuating the load, or preventing its activation via the touch plate.

The improved switch assembly can also include a known type of transmitter which, via conventional 110 volt house wiring, can transmit a signal to a remote receiver to sound an alarm or activate any other electrical device, such as a light, timer, etc. For example, such a signal can be transmitted to a receiver in the house of a neighbor, which is supplied electrical power from the same transformer when a person makes contact with a door latch coupled to the switch assembly.

Like the switch assembly taught in my aforementioned application Ser. No. 470,537, the improved switch assembly is particularly adapted for use in modifying entry light switching systems for buildings of the usual type comprising a light positioned to illuminate the entryway and outer surface of an entry door, the light being controlled from a conventional on-off switch in a conventional switch box and accessible from the inner surface of the building adjacent the door. The major portion of the switch assembly according to the present invention is adapted to physically replace the conventional on-off switch in the switch box. Besides such switch replacement, installation of the switch assembly requires only the installation of a contact means in the door frame for making electrical contact with conductive portions of the latch on the door when the door is latched, and the connection of a small signal wire between the contact means and the portion of the switch assembly in the switch box.

BRIEF DESCRIPTION OF THE DRAWING

The present invention will be further described with reference to the accompanying drawing wherein like numbers refer to like parts in the several views, and wherein:

FIG. 1 is a fragmentary perspective view of the entryway and entry light for a building having a touch controlled switch assembly according to the present invention installed to control the entry light via contact with a latch in the entry; the view having parts broken away to show details;

FIG. 2 is a block diagram of an embodiment of the switch assembly according to the present invention which is especially adapted for installation in an entryway such as is illustrated in FIG. 1;

FIG. 3 is a block diagram showing functional portions included in the switch assembly according to the present invention and indicating typical signal forms resulting therefrom; and FIG. 4 is a detailed circuit diagram of one embodiment of the switch assembly according to the present invention.

DESCRIPTION OF A PREFERRED EMBODIMENT

Referring now to FIG. 1 there is shown a switch assembly 10 according to the present invention installed in an entryway for a building 12. The switch assembly 10 includes a three position toggle switch 11 with a central off position which may be manually manipulated in a first direction to provide conventional activation of an entry light 14; and in the opposite direction to an automatic mode position so that the switch assembly 10 will operate the entry light 14 for a predetermined time after a person touches a conventional conductive latch 16 for a door 18 in the entryway.

The major portion of the switch assembly 10 is housed in a conventional switch box 20 adjacent the door 18, so that the three position toggle switch 11 is accessible from an inner surface of a wall 22 in the building 12. The switch assembly 10 is connected between a pair of electrical leads 24 carrying normal house voltage power from a source (not shown) and a pair of leads 25 which can carry the power to the light 14. Additionally, the switch assembly 10 is electrically connected to the conductive latch 16 via a single lead 26 and contact means 27 installed in the wall 22 in a position for contact by the latch 16 to complete electrical contact between the switch assembly and the latch 16 when the door 18 is closed.

The contact means 27 illustrated is particularly adapted for making a positive electrical contact with a conventional conductive latch 16 of the type comprising a bolt 29 movably mounted in the door 18 which may be manually driven by rotation of a driving member such as a doorknob 28 illustrated or a lock cylinder (not shown) between a retracted position within the door 18, and a position extended from the door 18. In its extended position, with the door 18 closed, the bolt 29 will project through an opening in a metal keeper 30 in the wall 22, and secure the door 18.

As illustrated in FIG. 1, the contact means 27 comprises a thin, conductive, flexible, resilient flat plate 34 such as of phosphor bronze. The plate 34 is slotted from one edge to provide spaced projecting fingers which are clamped between the keeper 30 for the bolt and the wall 22 and are positioned on opposite sides of one of a pair of attachment screws for the keeper 30 to position the end of the plate 34 opposite the fingers partially across the opening in the keeper 30. In this position the plate 34 will be deflected by the bolt 29 as it enters the keeper 30, and will remain mechanically biased against the bolt 29 to provide an efficient electrical contact therewith. One end of the lead 26 is wrapped around the attachment screw between the fingers 36 and is pressed against the plate 34 by pressure applied by the attachment screw to make electrical contact therewith to transfer signals received through the bolt 29 and plate 34 to the portion of the switch assembly 10 in the switch box 20.

Alternatively the lead 26 can be attached to the metal keeper 30 and a spring contact (not shown) can be provided to make contact between the metal keeper and a metal latch plate through which the bolt is guided when the door is closed; contacts can be attached to the door and frame for engagement when the door is closed, the one on the door being attached to the latch by a lead wire and the lead wire 26 being attached to the contact on the frame; or the lead 26 can be directly connected to the latch, and can extend across the door and exit the door at its hinged edge.

The elements of the switch assembly 10 are shown in the block diagram of FIG. 2. The electrically conductive door latch 16 provides a touch plate which is positioned for ready electrical contact by a person, and via the contact means 27 and lead 26 is adapted to conduct an incoming signal at the door latch 16 to the switch assembly 10. In the switch assembly 10 the incoming signal is received in a network 40 electrically connected to an input to a switch means 41 adapted for being switched from a first state to a second state when a signal having an intensity exceeding a predetermined level is applied at its input.

The network 40 explained in detail later herein, includes means for conditioning the incoming signal comprising means for blocking the incoming signal when it is of constant or slowly changing amplitude as is produced by the electrical noise component alone, and means for passing to the input of the switch means 41 as a triggering signal only instantaneous increases in the incoming signal as are caused by an individual contacting the door latch 16 (i.e. by "contact" we mean either direct electrical contact as with the bare hand or through a conductive key, or capacitive contact such as by a gloved hand).

The switch means 41 is adapted to provide an output signal when in its second state, which output signal is coupled to a slave switch 43 to control the application of electrical power to a load 44 (e.g. the light 14 and/or a remote or local alarm system). A dwell-time-constant network 46 controls the duration the switch means 41 remains in its second state and applies power to the load 44. Optionally, the switch means 41 also operates a transmitter 47, which when activated produces a remotely sensible alarm signal. The network 40, switch means 41 and dwell-time-constant network 46 are desirably operated from a power supply 49 providing low DC voltage source from the same electrical power source used to energize the load 44.

As shown in FIG. 3, the network 40 electrically coupled between the switch means 41 and the latch or touch plate 16 comprises means 55 adapted for referencing the incoming signal to a predetermined reference voltage. Waveform 56 illustrates a typical referenced incoming signal, wherein the first two cycles 56a of the waveform 56 illustrate the result of the noise component of the incoming signal while the third cycle 56b illustrates the result of an instantaneous increase in the incoming signal such as is caused by an individual contacting the touch plate 16. Means 57 adapted for integrating a portion of the referenced incoming signal produces a DC voltage 58 of one polarity relative to the reference voltage (i.e. negative relative thereto in the diagram shown wherein the lines connecting the blocks are assumed to represent the reference voltage, with voltages above or below being respectively positive or negative with respect thereto). The relative DC voltage 58 is slightly less than the peak to peak voltage of the incoming signal when the incoming signal is of constant or slowly changing amplitude (see waveforms 58a). A disproportionately small change, however, is produced in the DC voltage 58 when the incoming signal is instantaneously changed (see waveform 58b). Means 59 sums the referenced incoming signal 56 and the direct current signal 58 to produce a summed signal 60. The summed signal 60 is coupled to means 61 for blocking relatively negative portions of the summed signal 60 and for current amplifying the relatively positive portions thereof to produce a pulsating resultant signal 62. From signal 62 peak detecting means 63 produces a second DC signal 64 of only slightly less potential than the peak potential of the last received pulse of the resultant signal 62 (see waveforms 64a and 64b). Means 65 capacitively couples only rapidly changing portions 64b of the second DC signal 64 to the input to the switch means 41 as a triggering signal 66b; which rapidly changing portion 64b is produced by an individual contacting the touch plate 16. The peak detecting means 63 and the coupling means 65 thus provide means for blocking a constant or slowly changing resultant signal 62a and for passing to the switch means 41 as a triggering signal 66b only an instantaneous change in the resultant signal 62.

Referring now to FIGS. 3 and 4, the incoming signal at the latch 16 is coupled to the network 40 through a capacitor 68. After the capacitor 68, the incoming signal is referenced to a predetermined DC reference voltage slightly below 110 volts (e.g. about 94 volts) on a lead 67 through the means 55 comprising a resistor 69 and a diode 70. The reference voltage on lead 67 is produced from a hot or 110 volt carrying lead 53 of the power leads 24 by means including capacitor 76 and zener diode 75 in the power supply 49. The diode 70 also provides means for clamping a portion of the referenced incoming signal 56 to the reference voltage to produce a relatively negatively biased referenced signal portion at a node 71. A diode 72 passes only the portions of the biased referenced signal portion at the node 71 which are negative relative to the reference voltage. This relatively negative portion is integrated by a resistor 73 and a capacitor 74, which together with the clamping means provide the means 57 for integrating a portion of the incoming signal.

The values of the resistor 73 and capacitor 74 are selected to provide a time constant which will allow the capacitor 74 to maintain only slightly less negative DC voltage 58 (relative to the reference voltage) than the more negative peaks of the referenced biased signal at the node 71 when the incoming signal is constant or slowly changing (as from the noise component alone) but will not allow the DC voltage 58 across capacitor 74 to increase proportionately when an instantaneously increased incoming signal is received (as by someone contacting the latch 16). The DC voltage 58 from the capacitor 74 is applied as a bias voltage through a resistor 81 and sums at a node 82 with the referenced incoming signal 56 passing through a resistor 83. These components comprise the means 59 for providing at the node 82 the summed signal 60 which has a substantial portion thereof 60a more negative than the reference voltage, except when the signal is instantaneously increased 60b as by an individual contacting the latch 16. Under the latter condition the integrating means 57 produces no substantial offsetting bias voltage at the node 82.

A capacitor 84 and resistor 85 are also coupled to the node 82. Capacitor 84 shorts out high frequency transient incoming signals, such as are produced by lightning, while having little or no effect on desired operating frequencies in the range of 60 Hertz. Resistor 85 extends the operating range (i.e. amplitude of incoming signals) by providing an additional bias to an FET 86.

The summed signal 60 at the node 82 is applied to the gate electrode of the FET 86 which provides the means 61 for amplifying and rectifying the summed signal 60. The FET 86 blocks the portion of the summed signal 60 which is negative with respect to the reference voltage, and develops a pulsating resultant signal 62 across a resistor 87. The resultant signal 62 is of generally constant or slowly changing peak potential 62a when the incoming signal consists only of the noise component; and has an instantaneously increased peak potential 62b when the incoming signal is instantaneously increased. The FET 86 also provides a high impedance input for amplifying the current associated with the summed signal 60 to provide a resultant signal 62 with sufficient power to activate the switch means 41.

The means 63 for detecting the peaks in the resultant signal 62 comprises a diode 88, a capacitor 89 and a resistor 90. The capacitor 89 and resistor 90 are selected to provide a relatively fast rise time and slow decay time for the voltage across the capacitor 89, and are adapted to produce a DC potential across the capacitor 89 slightly less than the peak potential of the last received pulse of the resultant signal 62. Rapid increases in the DC potential across the capacitor 89 are coupled by the means 65 which means comprises a capacitor 91, to the input to the switch means 41. The combination of the peak detecting means 63 and capacitor 91 provides means for blocking resultant signals 62 of constant or slowly changing peak potentials, since a relatively steady DC voltage developed across the capacitor 89 is blocked from the switch means 41 by the capacitor 91.

The network 40 also includes a voltage divider comprising two resistors 94 and 95 to provide a fixed bias at the input to the switch means 41 and to afford activation of the switch means 41 with a small triggering signal.

The switch means 41 is preferably a monolithic integrated circuit timer such as a Signetics Corp. NE/-SE555. In this embodiment, terminal number 6 of the NE/SE555 is preferably selected as an input terminal because from terminal number 6 the NE/SE555 can be switched by a positive going triggering signal as is produced by the network 40.

The dwell-time-constant network 46 is coupled to terminals 2 and 3 of the NE/SE555. The time constant of the network 46, via the selection of the values of a resistor 97 and a capacitor 98, is selected to control the decay rate of a negative voltage applied to the terminal 2 from terminal 3 when the NE/SE555 is switched to its second state, and hence the duration of the second quasi-stable state (e.g. 2 minutes). The diode 99 enables the timer 41 to be reset by switching switch 11 from the automatic position to the off position and then back to the automatic position. A resistor 100 and a diode 101 are selected to rapidly charge the capacitor 98 with a short delay time after the timer 41 has been reset, and also prevents noise transients caused by the load such as a light 14 turning off, from retriggering the switch means 41. Accordingly, the load can be re-energized very quickly upon resetting the NE/SE555.

The output of the NE/SE555 is also coupled to the slave switch 43 which may be any variety of electromechanical relays or solid state analogs thereof. In the embodiment shown in FIG. 4, the output (terminal 3) of the NE/SE555 is applied to the gate of a triac 102 through resistor 103 to thereby couple the AC supply voltage to the load 14 during both halves of the AC cycle. Because triacs are significantly more difficult to trigger when a positive signal is applied to the gate at the time that the common electrode is positive (i.e. the fourth quadrant), in this embodiment the NE/SE555 solid state timer has been connected so as to provide a negative output signal at terminal number 3 in response to a positive going input signal on terminal number 6.

The optional transmitter 47 is coupled to the AC supply voltage and modulates the 60 cycle voltage with a high frequency signal when an output signal from terminal number 7 of the NE/SE555 is provided to the transmitter 47. The transmitter 47 includes capacitors 104 and 105, resistors 106 and 107, and preferably a ceramic element resonator 108 which is resonant at 185 KHz. Such a resonator 108 is manufactured by Mallory, Inc. as part number RMC185. Upon energization of the resonator 108, the thus produced oscillating signal is coupled through a transistor 109 to thereby couple the oscillating signal into the primary of a transformer 110. The secondary of the transformer 110 is coupled through a capacitor 111 to the AC supply line. A conventional receiver (e.g. Mallory, Inc. Model RH185 or RO185) tuned to the high frequency oscillation (i.e. 185 KHz) when coupled to the AC supply line may be readily adapted to respond to the presence of such modulations on the supply line and produce a remote alarm signal in response thereto, which signal may be utilized to activate additional alarms, access lights and the like.

The DC power supply 49, comprising a resistor 112, diodes 75 and 114, capacitor 76 and inductors 116 and 117, provides the aforementioned DC supply voltages by rectifying and filtering the AC supply in a conventional manner. The inductors 116 and 117 damp out high frequency transients such as may result from the energization of other electrical apparatus through the leads 24 and thereby prevent substantial portions of such transients from passing through the power supply 49 to the network 40.

When an individual contacts the touch plate 16, an instantaneous change in the incoming signal can be produced either by a static electrical charge transferred to the touch plate 16 by the individual's, or by the individual partially grounding the touch plate 16. The switch assembly 10 includes means adapted for providing an alternating potential at the touch plate 16 when the assembly is energized through the power supply 49. These means include the capacitor 76 which couples alternating voltage from the 110 volt lead 53 to the lead 67 and diodes 70 and 72, resistor 69 and capacitors 74 and 68 of the network 40. This alternating potential provides at least a portion of the electrical noise signal and is adapted to be safely grounded by an individual contacting the touch plate. Upon such partial grounding of this alternating potential an alternate path to ground is provided for this alternating potential and the voltage drop between the latch 16 and the lead 67 is instantaneously increased. This increase occurs primarily across the resistors 69, 81 and 83, there normally being substantially no current flow through the latch such that the latch is approximately the same potential as the lead 67. The increased voltage drop caused thereby between the lead 67 and the node 82 results in an increased signal at the node 82 and thereby an increase in amplitude of the resultant signal from the FET 86 to produce a triggering signal at the switch means 41 and has already been described.

The component values or designations in the following list have been found suitable for use in the switch assembly 10 as illustrated in FIG. 4.

| Capacitors | | | Resistors | | | |
|---|---|---|---|---|---|---|
| No. | Value | | No. | Values in ohms | | |
| 68 | 0.01 | μf | 69 | 1.0 | Meg | (¼ watt unless otherwise indicated) |
| 74 | 0.1 | μf | 73 | 22 | Meg | |
| 76 | 220 | μf | 81 | 15 | Meg | |
| 84 | 100 | pf | 83 | 7.5 | Meg | |
| 89 | 0.1 | μf | 85 | 22 | Meg | |
| 91 | 0.1 | μf | 87 | 10 | K | |
| 98 | 10 | μf | 90 | 10 | Meg | |
| 104 | 470 | pf | 94 | 560 | K | |
| 105 | 0.001 | μf | 95 | 1 | Meg | |
| 111 | 0.22 (400 VDC) | μf | 97 | 5.6 | Meg | |
| | | | 100 | 10 | K | |
| | | | 103 | 0.68 | K, ½ watt | |
| | | | 106 | 150 | K | |
| | | | 107 | 0.68 | K, ½ watt | |
| | | | 112 | 1.5 | K, 5 watt | |
| Inductors | | | Other | | | |
| No. | Value | | No. | Type | Designation | |
| 116 | 1 MH | | 86 | FET | MPF 112 | |
| 117 | 1 MH | | 102 | Triac | Q4008L4 | |
| | | | 109 | Transistor | 2N3900 | |
| | | | 110 | Transformer | 5:1 | |
| | | | 76 | Zener Diode | 16 Volt, 1 watt | |

I claim:

1. A switch assembly including:
switch means having an input and adapted for being switched from a first state to a second state when a triggering signal having an intensity exceeding a predetermined level is applied at said input;
a network coupled to the input of said switch means and adapted to electrically couple the input of said switch means to a touch plate such that when said switch assembly is energized by a conventional alternating electrical power source, there is at said touch plate an incoming signal comprising a continuously received alternating electrical noise component which may be of constant or slowly changing amplitude depending upon the ambient conditions at the touch plate and which incoming signal is instantaneously changed when an individual contacts the touch plate, wherein said network comprises:
means adapted for referencing the incoming signal to a predetermined reference voltage;
means adapted for integrating a portion of said referenced incoming signal having a time constant such that there is produced a direct current signal of one polarity relative to said predetermined reference voltage and of slightly less potential than the peak to peak potential of the incoming signal when the incoming signal is of constant or slowly changing amplitude such as is produced by the electrical noise component alone and such that a disproportionately small change is produced in the direct current signal when the incoming signal is instantaneously changed in potential such as is caused by an individual's contacting the touch plate;
means for summing said referenced incoming signal and said direct current signal to produce a summed signal; and
means for passing as a triggering signal to said switch means only instantaneous changes in portions of said summed signal of polarity opposite said one polarity.

2. A switch assembly according to claim 1 wherein said means adapted for integrating a portion of said incoming signal comprises means adapted for clamping the referenced incoming signal to said predetermined reference voltage to shift said referenced incoming signal portion toward said one polarity and means for integrating the portion of said clamped signal which is of said one polarity.

3. A switch assembly according to claim 1 wherein said network comprises intensifying means having a high impedance input and which is adapted for amplifying the current associated with said resultant signal to provide a triggering signal which exceeds said predetermined level and has sufficient power to activate said switching means.

4. A switch assembly according to claim 1 further comprising means adapted for providing an alternating potential at said touch plate when said assembly is energized by a conventional alternating electrical power source, said potential providing at least a portion of said electrical noise signal and being adapted to be safely grounded by an individual's contacting the touch plate, and means for producing an instantaneous change in the incoming signal upon partial grounding of said alternating potential by an individual's contacting the touch plate, so that when an individual contacts the touch plate a said instantaneous change in said incoming signal will be produced either by a static electrical charge transferred to the touch plate by the individual or by the individual's partially grounding the touch plate.

5. A switch assembly according to claim 1 wherein said switch assembly is adapted to receive incoming signals generally in the frequency range of conventional electrical alternating power sources such as 60 Hertz.

6. A switch assembly according to claim 1, wherein said means for passing comprises:
means for blocking portions of said summed signal of said one polarity to provide a resultant signal having a generally constant or slowly changing peak potential when the incoming signal consists only of the noise component and which resultant signal is instantaneously changed in potential with respect to said generally constant or slowly changing peak potential when the incoming signal is instantaneously changed; and means for blocking a constant or slowly changing resultant signal and for passing only an instantaneous change in said resultant signal as a triggering signal.

7. A switch assembly according to claim 6 wherein said means for blocking portions provides a pulsating resultant signal and said means for blocking a constant or slowly changing resultant signal comprises:

means for detecting peaks of said pulsating resultant signal to produce a second DC signal of only slightly less potential than the peak potential of the last received pulse of the resultant signal; and means for capacitively coupling to the input to said switch means as a triggering signal only rapid changes in said second DC signal as are produced when the resultant signal is instantaneously changed in potential by an individual's contacting the touch plate.

8. A switch assembly adapted to control an electric light for illuminating the entryway to a building said entryway comprising a wall, a door mounted in said wall for movement between an open and a closed position, and conductive latch means for releasably securing said door in said wall; said switch assembly being adapted to be mounted in a conventional switch box positioned in said wall adjacent said door; said switch assembly comprising:

switch means having an input and adapted for being switched from a first state to a second state when a triggering signal having an intensity exceeding a predetermined level is applied at said input and for providing an output signal when in said second state;

a network coupled to the input to said switch means and adapted to electrically couple the input of said switch to a said conductive latch means such that when said switch assembly is energized by a conventional alternating electrical power source, there is at said latch means an incoming signal comprising a continuously received alternating electrical noise component which may be of constant or slowly changing amplitude depending upon the ambient conditions at the latch means and which incoming signal is instantaneously changed when an individual contacts the latch means, said network comprising:

contact means adapted for installation in a said wall in a position for contact by a said latch means to complete electrical coupling between the latch means and said switch means when a door is closed;

means adapted for referencing the incoming signal to a predetermined reference voltage;

means adapted for integrating a portion of said referenced incoming signal having a time constant such that there is produced a direct current signal of one polarity relative to said predetermined reference voltage and of slightly less potential than the peak to peak potential of the incoming signal when the incoming signal is of constant or slowly changing amplitude such as is produced by the electrical noise component alone and such that a disproportionately small change is produced in the direct current signal when the incoming signal is instantaneously changed in potential such as is caused by an individual's contacting the latch means;

means for summing said referenced incoming signal and said direct current signal to produce a summed signal; and means for passing as a triggering signal to said switch means only instantaneous changes in portions of said summed signal of polarity opposite said one polarity;

means coupled to said switch means for controlling the time during which said switch means remains in said second state;

means coupled to receive said output signal and adapted to be connected for controlling the application of electrical power to the electric light; and means adapted to be coupled to a conventional electrical power source for energizing said switch means, said network and said means for controlling the time.

9. A switch assembly according to claim 8 further comprising means adapted for providing an alternating potential at said latch means when said assembly is energized by a conventional alternating electrical power source, said potential providing at least a portion of said electrical noise signal and being adapted to be safely grounded by an individual's contacting the latch means, and means for producing an instantaneous change in the incoming signal upon partial grounding of said alternating potential by an individual's contacting the latch means, so that when an individual contacts the latch means said instantaneous change in said incoming signal can be produced either by a static electrical charge transferred to the latch means by the individual, or by the individual's partially grounding the latch means.

10. A switch assembly according to claim 8, wherein said means for passing comprises:

means for blocking portions of said summed signal of said one polarity to provide a resultant signal having a generally constant or slowly changing peak potential when the incoming signal consists only of the noise component and which resultant signal is instantaneously changed in potential with respect to said generally constant or slowly changing peak potential when the incoming signal is instantaneously changed; and means for blocking a constant or slowly changing resultant signal and for passing only an instantaneous change in said resultant signal as a triggering signal.

11. A switch assembly according to claim 10 wherein:

said means adapted for integrating a portion of said incoming signal comprises means adapted for clamping the referenced incoming signal to said predetermined reference voltage to shift said referenced incoming signal portion toward said one polarity, and means for integrating the portion of said clamped signal which is of said one polarity;

said network includes intensifying means having a high impedance input and which is adapted for amplifying the current associated with said resultant signal to provide a triggering signal which exceeds said predetermined level and has sufficient power to activate said switching means;

said means for blocking portions provides a pulsating resultant signal; and said means for blocking a constant or slowly changing resultant signal comprises:

means for detecting peaks of said pulsating resultant signal to produce a second DC signal of only slightly less potential than the peak potential of the last received pulse of the resultant signal; and means for capacitively coupling to the input to said switch means as a triggering signal only rapid changes in said second DC signal as are produced when the resultant signal is instantaneously changed in potential by an individual's contacting a said latch means.

12. A method for changing the state of an electrical switch means upon contact of an individual with a touch plate at which touch plate there is an incoming signal comprising a continuously received alternating electrical noise component which may be of constant or slowly changing amplitude depending upon ambient conditions at the touch plate and which incoming signal is instantaneously changed when an individual contacts the touch plate, said method comprising:

providing switch means having an input adapted for being switched from a first state to a second state when a triggering signal having an intensity exceeding a predetermined level is applied at said input;

referencing the incoming signal to a predetermined reference voltage;

integrating a portion of the referenced incoming signal to produce a direct current signal of one polarity relative to said predetermined reference voltage and of slightly less potential than the peak to peak potential of the incoming signal when the incoming signal is of constant or slowly changing amplitude such as is produced by the electrical noise component alone and to produce a disproportionately small change in the direct current signal when the incoming signal is instantaneously changed in potential such as by an individual's contacting the touch plate;

summing said referenced incoming signal and said direct current signal to produce a summed signal mostly of said one polarity when the incoming signal consists only of the noise component and having a substantial portion of a polarity opposite said one polarity when the incoming signal is instantaneously changed; and passing as a triggering signal to said switch means only instantaneous changes in portions of said summed signal of polarity opposite said one polarity.

13. A method according to claim 12 further comprising the steps of:

providing an alternating potential at said touch plate, said potential providing at least a portion of said electrical noise signal and being adapted to be safely grounded by an individual's contacting the touch plate; and producing an instantaneous change in the incoming signal upon partial grounding of said alternating potential by an individual's contacting the touch plate so that when an individual contacts the touch plate said instantaneous change in said incoming signal will be produced either by a static electrical charge transferred to the touch plate by the individual or by the individual's partially grounding the touch plate.

14. A method according to claim 12 wherein said passing step comprise the steps of:

blocking portions of said summed signal of said one polarity to provide a pulsating resultant signal having a generally constant or slowly changing peak potential when the incoming signal consists only of the noise component and which resultant signal is instantaneously changed in potential with respect to said generally constant or slowly changing peak potential when the incoming signal is instantaneously changed;

detecting peaks of said pulsating resultant signal to produce a second DC signal of only slightly less potential than the peak potential of the last received pulse of the resultant signal; and capacitively coupling to the input to said switch means as a triggering signal only rapid changes in said second DC signal as are produced when the resultant signal is instantaneously changed in potential by an individual's contacting the touch plate.

* * * * *